(12) United States Patent
Wang et al.

(10) Patent No.: US 8,552,774 B2
(45) Date of Patent: Oct. 8, 2013

(54) FAST-SWITCHING LOW-NOISE CHARGE PUMP

(75) Inventors: Shen Wang, San Jose, CA (US); Sang-Oh Lee, Cupertino, CA (US); Jeongsik Yang, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 269 days.

(21) Appl. No.: 13/208,456

(22) Filed: Aug. 12, 2011

(65) Prior Publication Data

US 2011/0291716 A1    Dec. 1, 2011

Related U.S. Application Data

(62) Division of application No. 11/953,575, filed on Dec. 10, 2007, now Pat. No. 8,018,269.

(60) Provisional application No. 60/987,678, filed on Nov. 13, 2007.

(51) Int. Cl.
*H03L 7/06*    (2006.01)

(52) U.S. Cl.
USPC ......................................................... 327/157

(58) Field of Classification Search
USPC .................................. 327/147, 148, 156, 157
See application file for complete search history.

(56) References Cited

U.S. PATENT DOCUMENTS

| | | | |
|---|---|---|---|
| 4,792,705 A | 12/1988 | Ouyang et al. | |
| 4,860,073 A | 8/1989 | Michon | |
| 5,247,208 A | 9/1993 | Nakayama | |
| 5,825,640 A | 10/1998 | Quigley et al. | |
| 5,886,551 A | 3/1999 | Narahara | |
| 6,054,882 A * | 4/2000 | Izumikawa | 327/157 |
| 6,255,872 B1 | 7/2001 | Harada et al. | |
| 6,370,075 B1 | 4/2002 | Haeberli et al. | |
| 6,420,914 B1 | 7/2002 | Hasegawa | |
| 6,472,915 B1 | 10/2002 | Moyal et al. | |
| 6,731,145 B1 * | 5/2004 | Humphreys et al. | 327/156 |

(Continued)

FOREIGN PATENT DOCUMENTS

| | | |
|---|---|---|
| CN | 1902823 A | 1/2007 |
| DE | 19910113 | 8/2000 |

(Continued)

OTHER PUBLICATIONS

International Search Report—PCT/US08/083261, International Search Authroity—European Patent Office—Feb. 4, 2009.

(Continued)

*Primary Examiner* — Lincoln Donovan
*Assistant Examiner* — Sibin Chen
(74) *Attorney, Agent, or Firm* — Kevin T. Cheatham (57) ABSTRACT

In one embodiment of the invention, a method for a charge pump is disclosed. The method includes biasing a plurality of transistors; switching a pair of main transistor switches to apply or remove a net charge on an output terminal though the biased transistors; and turning on auxiliary transistor switches when the main transistor switches are turned off. The auxiliary transistor switches when turned on provide an auxiliary equalizing path to nodes between the main transistor switches and the biased transistors. The auxiliary equalizing path equalizes voltages between the intermediate nodes to rapidly turn off the biased transistors and reduce noise on the output terminal of the charge pump.

19 Claims, 6 Drawing Sheets

(56) References Cited

U.S. PATENT DOCUMENTS

| | | |
|---|---|---|
| 6,744,292 B2 | 6/2004 | Chen et al. |
| 6,960,949 B2 * | 11/2005 | Suzuki ................ 327/157 |
| 7,020,793 B1 | 3/2006 | Hsieh |
| 7,102,400 B1 | 9/2006 | Mulders |
| 7,123,055 B1 | 10/2006 | Chong et al. |
| 7,161,401 B2 | 1/2007 | Li |
| 7,190,231 B2 | 3/2007 | Park |
| 7,439,784 B2 | 10/2008 | Lin |
| 8,018,269 B2 | 9/2011 | Wang et al. |
| 8,049,541 B2 | 11/2011 | Haerle |
| 2002/0003452 A1 * | 1/2002 | Mizuno et al. ................ 331/2 |
| 2003/0048126 A1 | 3/2003 | Watarai |
| 2010/0090753 A1 | 4/2010 | Yan |

FOREIGN PATENT DOCUMENTS

| | | |
|---|---|---|
| JP | 1293718 A | 11/1989 |
| JP | 9266443 A | 10/1997 |
| JP | 2000269808 A | 9/2000 |
| JP | 2002246905 A | 8/2002 |
| JP | 2003087115 A | 3/2003 |
| JP | 2003298414 A | 10/2003 |
| JP | 2006165680 A | 6/2006 |
| JP | 2007180954 A | 7/2007 |
| WO | WO2006087508 A1 | 8/2006 |

OTHER PUBLICATIONS

Written Opinion—PCT/US08/083261, International Search Authroity—European Patent Office—Feb. 4, 2009.
Taiwan Search Report—TW097143950—TIPO—Dec. 18, 2011.

* cited by examiner

FAST-SWITCHING LOW-NOISE CHARGE PUMP

PRIORITY

This application is a divisional of U.S. patent application Ser. No. 11/953,575 filed on Dec. 10, 2007, titled "FAST-SWITCHING LOW-NOISE CHARGE PUMP", which also claims benefit of U.S. Provisional Application No. 60/987,678 titled "FAST-SWITCHING LOW-NOISE CHARGE PUMP," filed Nov. 13, 2007, the entire disclosure of this application being considered part of the disclosure of this application.

FIELD

The embodiments of the invention relate to charge pumps, voltage controlled oscillators, phase-locked loops, and frequency synthesizers.

BACKGROUND

Charge pumps are used as a building block or sub-circuit in a number of larger circuits or systems. Some circuits or systems may be more or less sensitive to noise that is generated by a charge pump. In those systems that are more sensitive to noise, a reduction of noise otherwise generated by a charge pump is desirable. That is, a lower noise charge pump may improve the performance of the circuit or system of which it is a part.

BRIEF SUMMARY

The embodiments of the invention are summarized by the claims that follow below.

DETAILED DESCRIPTION

In the following detailed description of the embodiments of the invention, numerous specific details are set forth in order to provide a thorough understanding. However, the embodiments of the invention may be practiced without these specific details. In other instances well known methods, procedures, components, and circuits have not been described in detail so as not to unnecessarily obscure aspects of the embodiments of the invention.

A charge pump circuit is often used as a building block in a voltage controlled oscillator (VCO), a phase-locked loop (PLL) or a frequency synthesizer.

Figure 1:
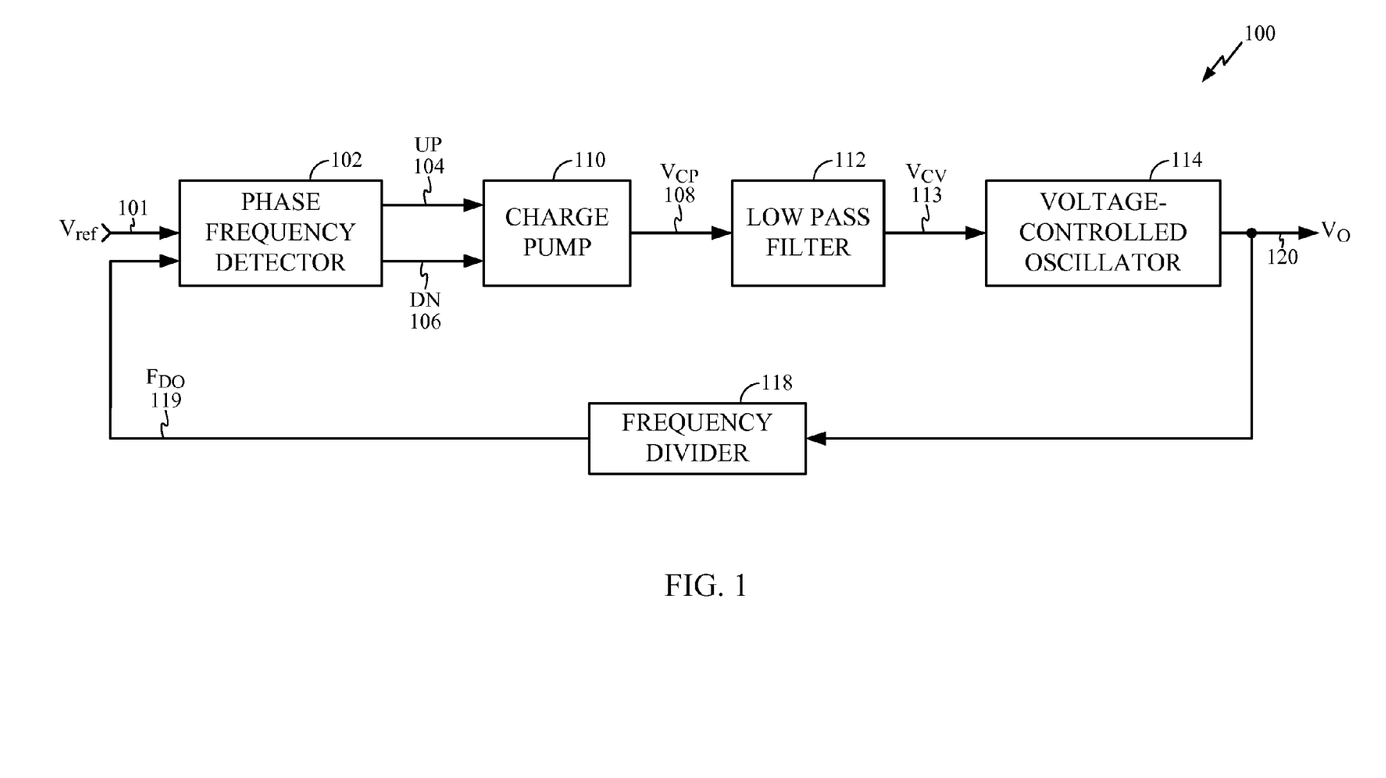
FIG. 1 is a functional block diagram of a phase locked loop (PLL) in which the charge pump of FIG. 2 may be used.

Referring now to FIG. 1, a functional block diagram of a phase-locked loop (PLL) 100 is illustrated. The PLL 100 includes a phase frequency detector 102, a charge pump 110, a low pass filter 112, a voltage-controlled oscillator (VCO) 114, and a frequency divider 118 coupled together as shown in FIG. 1.

A reference clock Vref 101 is coupled into the phase frequency detector 102 as is the frequency divider output FDO 119 from the frequency divider 118 for the purpose of comparison. The phase frequency detector 102 generates an up-pulse signal UP 104 and a down-pulse signal DN 106. The pulse duration difference between the up-pulse signal UP 104 and the down pulse signal DN 106 represents the detected phase difference between the reference clock Vref 101 and the output signal from the frequency divider 118. The up pulse signal UP 104, the down pulse signal DN 106 and their respective complements UP', DN' are coupled into the charge pump 110 and may collectively be referred to herein as frequency control signals.

Driven by the up and down pulse signals 104,106 and their complements, the charge pump 110 sources current into or sinks current from the low pass filter 112 to generate a control voltage signal at the output Vcp 108 of the charge pump 110. The charge pump output signal Vcp 108 of the charge pump 110 contains a DC component that is proportional to the phase difference between the reference clock Vref and the frequency divider output FDO 119 of the frequency divider 118. The embodiment of the charge pump (see charge pump 200 of FIG. 2) further disclosed herein is used as the charge pump 110 in the PLL 100. The output Vcp 108 of the charge pump 110 is coupled into the low pass filter 112.

The low pass filter 112 substantially removes (filters out) undesired AC components from the output signal Vcp of the charge pump 110 before coupling the filtered Vcp signal as a DC control voltage Vcv 113 into the VCO 114.

According to its DC control voltage Vcv 113, the VCO 114 produces an output clock signal Vo 120 of variable frequency. A higher DC control voltage Vcv 113 may increase the frequency of the output clock signal Vo 120 while a lower control voltage may decrease the frequency. Alternatively, a lower DC control voltage Vcv 113 may increase the frequency of the output clock signal Vo 120 while a higher control voltage may decrease the frequency. The output clock signal Vo 120 is coupled into the frequency divider 118 in a feedback path of the PLL 100.

The frequency divider 118 divides down the number of clock cycles in the output clock signal Vo 120 and shifts its phase to better match that of the reference clock signal Vref 101. The PLL 100 is in a lock-in condition when the reference clock signal Vref 101 and the frequency divider output signal FDO 119 are locked together in both phase and frequency.

In a phase locked loop, in-band phase noise is largely determined by having a non-ideal charge pump. It has been observed that a significant noise contribution from a charge pump is due to a long switching-off time of the output transistors in the output stage of the charge pump. That is charge pump noise is proportional to the switching time of the output transistor. Thus, a charge pump with fast-switching capability is desirable for low in-band phase noise phase locked loops.

Figure 2:
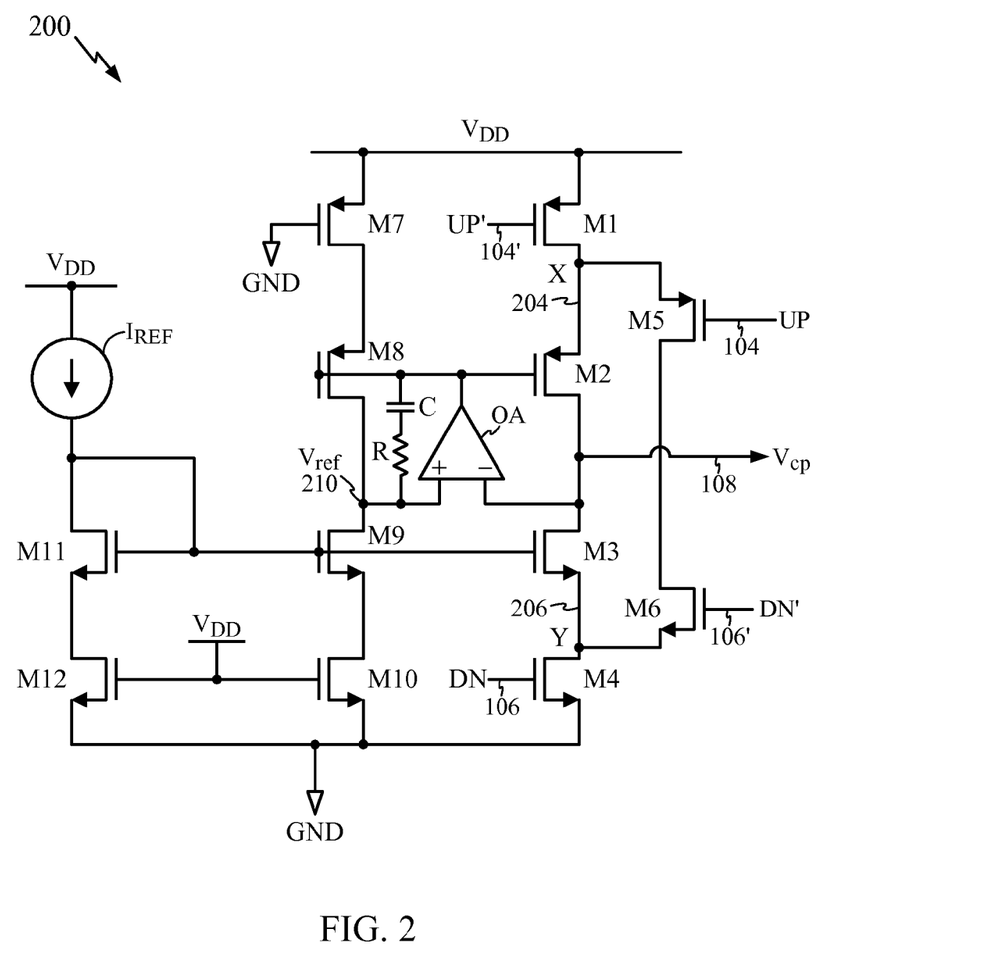
FIG. 2 is a schematic diagram of the charge pump including auxiliary switches to reduce noise.

Referring now to FIG. 2, a schematic of a charge pump circuit 200 is illustrated. The charge pump circuit 200 includes P-channel field effect transistors (PFETs) M1-M2, M5, M7-M8; N-channel field effect transistors (NFETs) M3-M4, M6, M9-M10, M11-M12; reference current source Iref; resistor R; capacitor C; and operational amplifier OA coupled together as shown between a positive power supply terminal VDD and a ground terminal GND. Each of the NFETs and PFETs have gate (control), source, and drain terminals.

Transistors M1 through M4 form an output transistor leg of the charge pump while transistors M7 through M10 form another transistor leg (parallel transistor leg) of the charge pump in parallel with the output transistor leg. The operational amplifier OA with the series coupled resistor R and the capacitor C in a feedback loop, functions between the output transistor leg and the parallel transistor leg to bias transistors M2 and M8. The current source Iref and the transistors M11 and M12 provide a bias voltage to transistors M3 and M9.

Transistors M1 through M4 are paired with transistors M7 through M10, respectively, with the scaling factor between each pair being the same. The scaling factor is the ratio of transistor aspect ratios between paired transistors. The transistor aspect ratio for a given transistor is determined by dividing its transistor width by its transistor length. When transistor M4 is on, transistors M3 and M9 are a current mirror pair of transistors but may have different aspect ratios. When transistor M1 is on, transistors M2 and M8 are also a current mirror pair of transistors but may have different aspect ratios.

Transistors M10, and M12 have their gates tied to the power supply terminal Vdd and transistor M7 has its gate tied to the ground terminal GND so that they may be always turned on. Transistors M7, M10, and M12 may be referred to herein as being constantly on transistors. Transistors M11, M9, and M3 are current mirror transistors and have their gates coupled to the same node. Transistors M9 and M11 normally are turned on to operate in the saturation region of a MOSFET. Transistor M3 is switched into and out of saturation in response to transistor M4 being switch on and off. When transistor M4 is switched off, transistor M3 exits saturation and is ideally turned off as well due to a reduced gate to source voltage. Transistor M11 has its gate terminal coupled to its drain terminal. Transistor M11 may be referred to herein as a diode-connected transistor. The voltage applied to the gates of transistors M3 and M9 is the same to try to bias them on but the gate to source voltage of transistor M3 may vary. Assuming transistor M4 is turned on by DN 106 being high, transistors M3, M9 and M11 may have the same gate-to-source voltages. If so, the current in each leg may be established by the scaling factor between paired transistors, their aspect ratios (defined by W/L), and the level of current supplied by the reference current source Iref. The aspect ratios of transistors M11 and M12 may be relatively smaller in respective comparison to transistors M3,M9 and M4,M10. This may reduce the amount of reference current Iref flowing through transistors M11-M12 and the power consumption of the charge pump. Transistors M3 and M9 provide a voltage-controlled current source in each leg of the charge pump. Thus, transistors M3 and M9 may be referred to herein as voltage-controlled current source transistors or simply biased transistors.

The reference current source Iref in conjunction with the transistors M7-M12, form a bias circuit to generate a reference voltage Vref 210 at the connecting node 210 between transistors M8 and M9. With the assistance of the operational amplifier OA and its feedback, the reference voltage Vref 210 tracks the charge pump output voltage at the charge pump output Vcp 108. The voltage reference Vref 210 assures that the up current supplied from Vdd through transistors M1 and M2 to the charge pump output Vcp 108 when transistor M1 is turned on, substantially matches the down current pulled through transistors M3 and M4 into ground from the charge pump output Vcp 108 when transistor M4 is turned on.

The operational amplifier OA has its positive input terminal coupled to the Vref node 210 and its negative input terminal coupled to charge pump output node Vcp 108. The output terminal of the operational amplifier OA is coupled to the gate terminals of matched transistors M2 and M8. The gates of transistors M2 and M8 are equally biased by a voltage output of operational amplifier OA.

The resistor R and the capacitor C are coupled in series together between the positive input terminal and the output terminal of the operational amplifier OA to form a negative feedback loop. The operational amplifier OA and the resistor R and the capacitor C in the negative feedback loop form another biasing circuit that is used to bias transistors M2 and M8. The use of the operational amplifier OA in a negative feedback loop is to achieve good matching between the up current source through transistors M1-M2 and the down current source through transistors M3-M4 in the output transistor leg.

The operational amplifier OA generates a biasing gate voltage for transistors M2 and M8 that may vary to maintain them turned on. Transistors M2 and M8 may be referred to herein as current mirror or simply biased transistors.

Normally, the voltage levels of Vref and Vcp are similar and coupled into the operational amplifier OA. However if the voltage at the charge pump output Vcp 108 goes lower, the operational amplifier OA tries to compensate by increasing the output voltage slightly so that the reference voltage Vref 210 is close to the voltage at the charge pump output Vcp 108. Conversely, if the voltage at the charge pump output Vcp 108 goes higher, the operational amplifier OA also tries to compensate by reducing the output voltage slightly so that the reference voltage Vref 210 is close to the voltage at the charge pump output Vcp 108.

Transistors M1 and M4 have their gates respectively coupled to the UP' signal 104' and the DN signal 106, source terminals respectively coupled to the power supply terminal VDD and the ground terminal GND, and drain terminals respectively coupled to an intermediate node X 204 and an intermediate node Y 206 that are coupled to the sources of transistors M2 and M3, respectively. Transistors M1 and M4 are the main switch transistors in the charge pump 200. Transistor M1 supplies a charge from the power supply VDD into the node X 204 when switched on. Transistor M4 drains charge from node Y 206 into ground GND when switched on.

Transistors M5 and M6 are auxiliary switching transistors to that of the main switching transistors M1 and M4. Transistors M5 and M6 have drain terminals coupled together, source terminals respectively coupled to the node X 204 (drain of transistor MD and the node Y 206 (drain of transistor M4), and gate terminals respectively coupled to the UP signal 104 and the DN' signal 106'. When transistors M5 and M6 are turned on, an auxiliary path is formed between nodes X 204 and Y 206 to more quickly turn off transistors M2 and M3. Transistors M5 and M6 may also be considered as equalizing transistors as they equalize voltages between nodes X and Y when the charge pump 200 switches away from supplying or dissipating a charge on the charge pump output Vcp 108.

If the charge pump 200 is a subcircuit in a PLL or frequency synthesizer, the control signals UP 104, DN 106 and their respective complements UP' 104', DN' 106' may be generated by a phase frequency detector. The complement signals UP' 104', DN' 106' are logically inverted from the control signals UP 104, DN 106, respectively.

If the voltage on the charge pump output Vcp 108 is to be increased, the leading edge of UP 104 pulse signal is generated earlier than the leading edge of DN 106 pulse signal to switch pull-up transistor M1 on earlier than switching the pull-down transistor M4 on. However the trailing edges of both the UP 104 pulse signal and the DN 106 pulse signal are generated substantially at the same time so that both transistors M1 and M4 are switched off at the same time. Thus, the UP 104 pulse signal is wider than the DN 106 pulse signal so that the charge pump supplies a net charge to the charge pump output Vcp 108 to increase the voltage output.

If the voltage on the charge pump output Vcp 108 is to be lowered, the leading edge of the DN 106 pulse signal is generated earlier than the leading edge of the UP 104 pulse signal to switch the pull down transistor M4 on earlier than the pull-up transistor M2. However the trailing edges of both the UP 104 pulse signal and the DN 106 pulse signal are generated substantially at the same time so that both transistors M1 and M4 are switched off at the same time. Thus, the DN pulse signal 106 is wider than the UP pulse signal 104 so that the charge pump dissipates a net charge from the charge pump output Vcp 108 to decrease the voltage output.

Figure 3A:
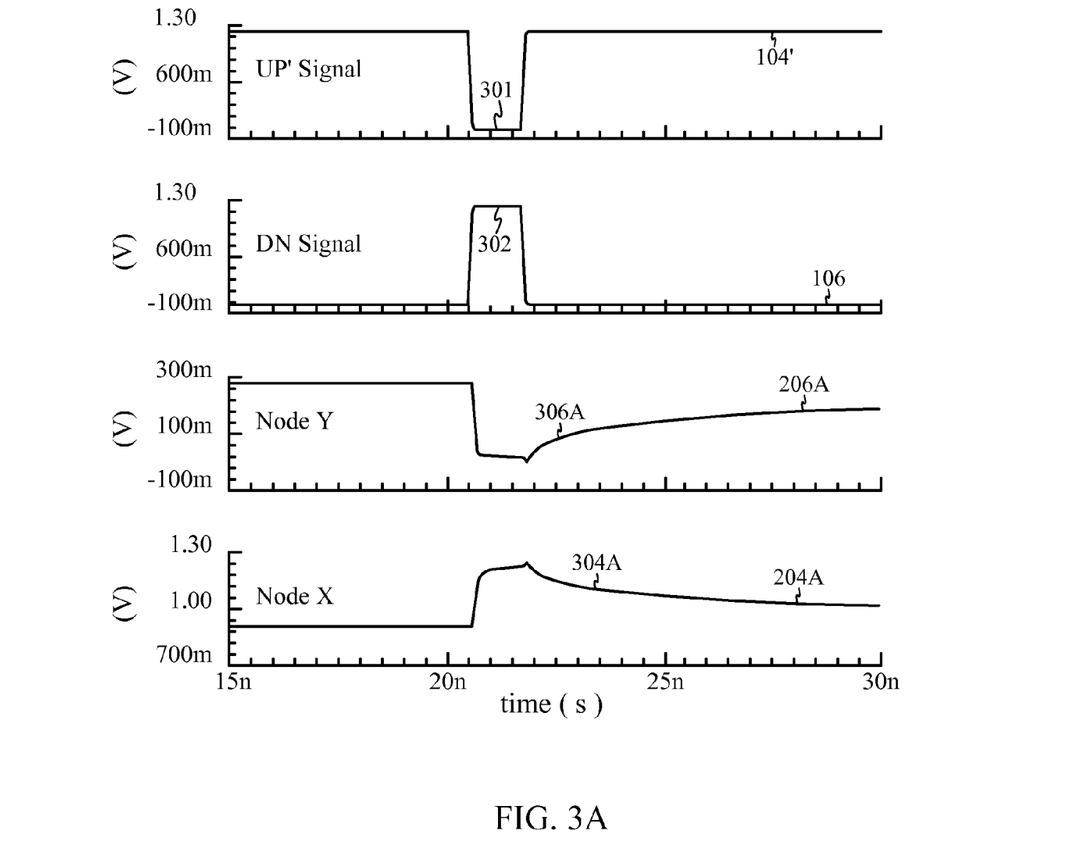
FIG. 3A are diagrams illustrating transient waveforms of the charge pump without the auxiliary switches.
Figure 3B:
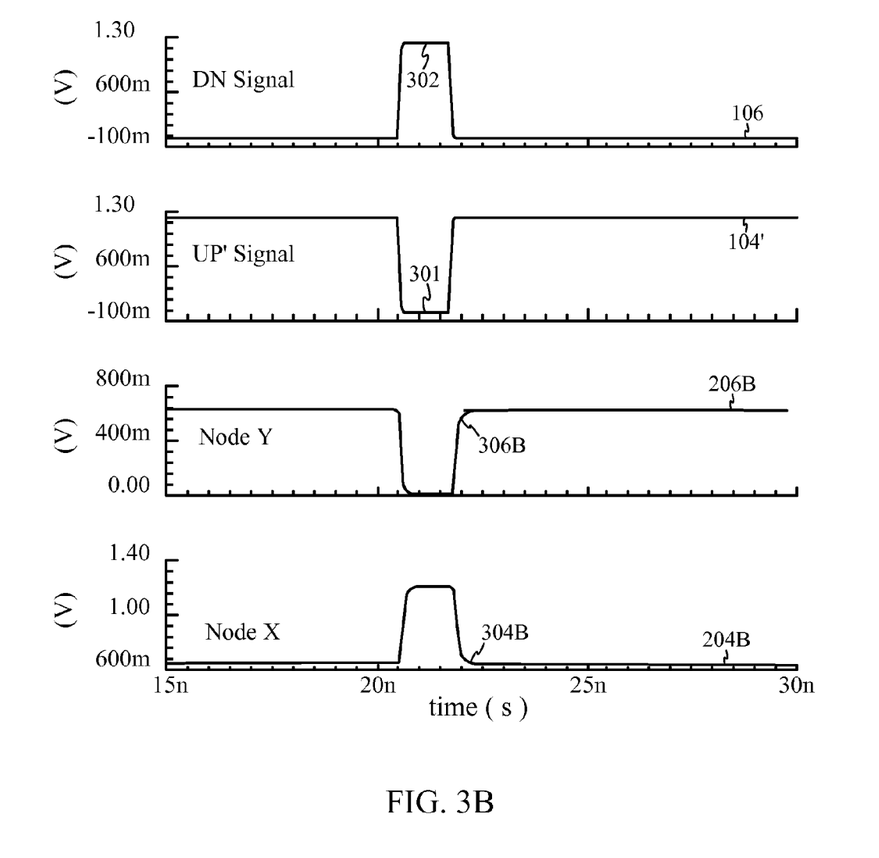
FIG. 3B are diagrams illustrating transient waveforms of the charge pump with the auxiliary switches.

If the voltage on the charge pump output Vcp 108 is of an appropriate level, neither of the UP 104 or DN 106 control signals may be generated to further charge or discharge the charge pump output Vcp 108. The UP 104 and DN 106 control signals are substantially similarly generated so that both of the main switches M1 and M4 are switch on and off at substantially the same time. Thus, the UP 104 and DN 109 pulse signals have the same width so that no net charge is coupled onto or out of the charge pump output Vcp 108 to increase or decrease the voltage output, sometimes referred to as a lock condition. The waveforms illustrated in FIGS. 3A and 3B illustrate the lock condition where the UP 104 and DN 109 pulse signals are generated substantially at the same time and have the substantially same pulse widths.

The DN pulse signal 106 is coupled to the gate of main switch transistor M4. The DN' pulse signal 106' is coupled to the gate of equalizing switch transistor M6. During a DN pulse signal, the main switch transistor M4 is switched on and the equalizing switch transistor M6 is turned off. After the DN pulse signal, the main switch transistor M4 is switched off and the equalizing switch transistor M6 is turned on.

The UP' pulse signal 104' is coupled to the gate of main switch transistor M1. The UP pulse signal 104 is coupled to the gate of the equalizing switch transistor M5. During the UP' pulse signal, the main switch transistor M1 is switched on and the equalizing switch transistor M5 is turned off. After a UP' pulse signal, the main switch transistor M1 is switched off and the equalizing switch transistor M5 is turned on.

When both of the main switch transistors M1 and M4 are turned on, both of the auxiliary switch transistors M5 and M6 are turned off. With both of the main switch transistors M1 and M4 turned on, the internal node X 204 is rapidly charged up to Vdd through transistor M1 and the internal node Y 206 is rapidly discharged down to ground through transistor M4.

When both of the main switch transistors M1 and M4 are turned off, both of the auxiliary switch transistors M5 and M6 are turned on. With both of the auxiliary switch transistors M5 and M6 are turned on, an equalization path is established between node X 204 and node Y 206. The lack of charges on node Y 206 helps to rapidly discharge internal node X 204 while the charges on internal node X 204 helps to rapidly charge up internal node Y 206. As a result, the transistors M2 and M3 are rapidly turned off and the voltage on internal node X 204 and internal node Y 206 is between the power supplies Vdd and Ground.

Without the auxiliary switch transistors M5-M6, the transistors M2 and M3 are not turned off until the internal node X 204 and internal node Y 206 reach appropriate voltage levels when UP' 104' is logically high and DN 106 is logically low. Without the auxiliary switch transistors M5-M6, the time to switch off transistors M2 and M3 is significantly longer than the time to switch on transistors M2 and M3 as a result of a high impedance seen by the internal node X 204 and internal node Y 206 when the main switch transistors M1 and M4 are turned off.

Referring now to FIGS. 3A-3B, transient waveforms of input signals DN 106, UP' 104' and the simulation results of nodes X 204, Y 206 in the charge pump are illustrated respectively without and with the charge equalizing transistors M5 and M6 with the same device sizes and under the same conditions (power supply voltage, temperature and process corner).

As mentioned previously, the waveforms illustrated in FIGS. 3A and 3B illustrate the lock condition where the UP 104 and DN 109 pulse signals are generated substantially at the same time and have the substantially same pulse widths. Thus, waveforms 106 and 104' for the DN signal 106 and the UP' signal respectively illustrated in FIGS. 3A-3B are the same. An UP' pulse 301 and a DN pulse 302 are respectively formed in the waveforms 104' and 106. The simulation results between FIGS. 3A and 3B differ for the nodes X 204 and Y 206. In FIG. 3A, the waveforms 204A and 206A respectively represent the simulation results for nodes X 204 and Y 206 without the equalizing transistors M5 and M6. In FIG. 3B, the waveforms 204B and 206B respectively represent the simulation results for nodes X 204 and Y 206 with the equalizing transistors M5 and M6 and the added equalizing path between the nodes.

Parasitic capacitance is present at nodes X 204 and Y 206 due to a number of factors, including the semiconductor manufacturing of the charge pump within an integrated circuit on a semiconductor substrate. In waveforms 204A and 206A of FIG. 3A, the effects of the parasitic capacitance on nodes X 204 and Y 206 and the lack of any additional auxiliary path to discharge or charge may be seen. At point 306A, the voltage of node Y 206 gradually increases to fully turn off transistor M3 overcoming the fully discharged parasitic capacitance. At point 304A, the voltage of node X 204 gradually decreases to fully turn off transistor M2 overcoming the fully charged parasitic capacitance. When the auxiliary transistors M5 and M6 turn on, an equalizing path is formed between nodes X 204 and Y 206 so that the nodes are respectively rapidly discharged and rapidly charged.

Comparing waveforms 204B and 204A respectively at points 304B and 304A, it can be seen that node X 204 is quickly pulled towards ground to quickly switch off transistor M2 as a result of the voltage equalizing transistors M5 and M6 being turned on to provide the equalizing path. Quickly decreasing the voltage on node X 204 and the drain of transistor M1 while the voltage applied to the gate of transistor M1 is being increased to turn it off, more quickly shuts off transistor M2.

Comparing waveforms 206B and 206A respectively at points 306B and 306A, it can be seen that node Y 206 is more quickly pulled towards the positive power supply Vdd to quickly switch off transistor M3 as a result of the voltage equalizing transistors M5 and M6 being turned on to provide the equalizing path. Quickly increasing the voltage on node Y 206 and the drain of transistor M4 while the voltage applied to the gate of the transistor M4 is being reduced to turn it off, more quickly shuts off transistor M3.

Thus with the auxiliary switch transistors M5 and M6, the time to switch off transistors M2 and M3 is reduced. Noise generated by a charge pump is proportional to the pulse width of the charging cycle on the output terminal. It is expected that switching off transistors M2 and M3 sooner will reduce the noise generated by a charge pump.

Figure 4:
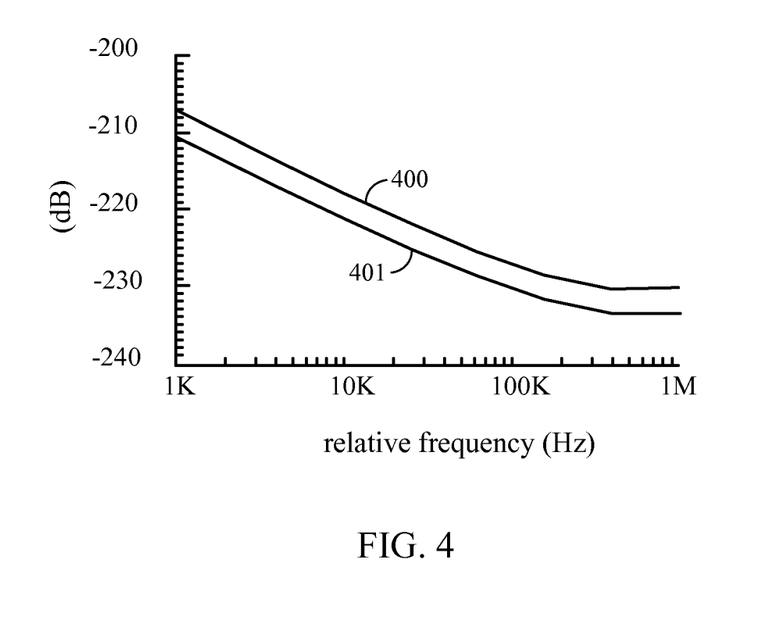
FIG. 4 is a waveform diagram to compare output noise of the charge pump with and without the auxiliary switches.

Referring now to FIG. 4, noise power waveforms 400 and 401 derived from simulation are illustrated. Waveform 400 shows the output noise power of the charge pump without the auxiliary switch transistors M5 and M6. Waveform 401 shows the output noise power of the charge pump with the auxiliary switch transistors M5 and M6, a reduction from that of waveform 400. A noise power reduction of approximately three decibels (3 dB) may be achieved in the charge pump 200 with the auxiliary switch transistors M5 and M6. Thus, the charge pump circuit 200 has fast-switching and low noise characteristics. The charge pump circuit 200 may be used in phase locked loops or other circuits.

Figure 5:
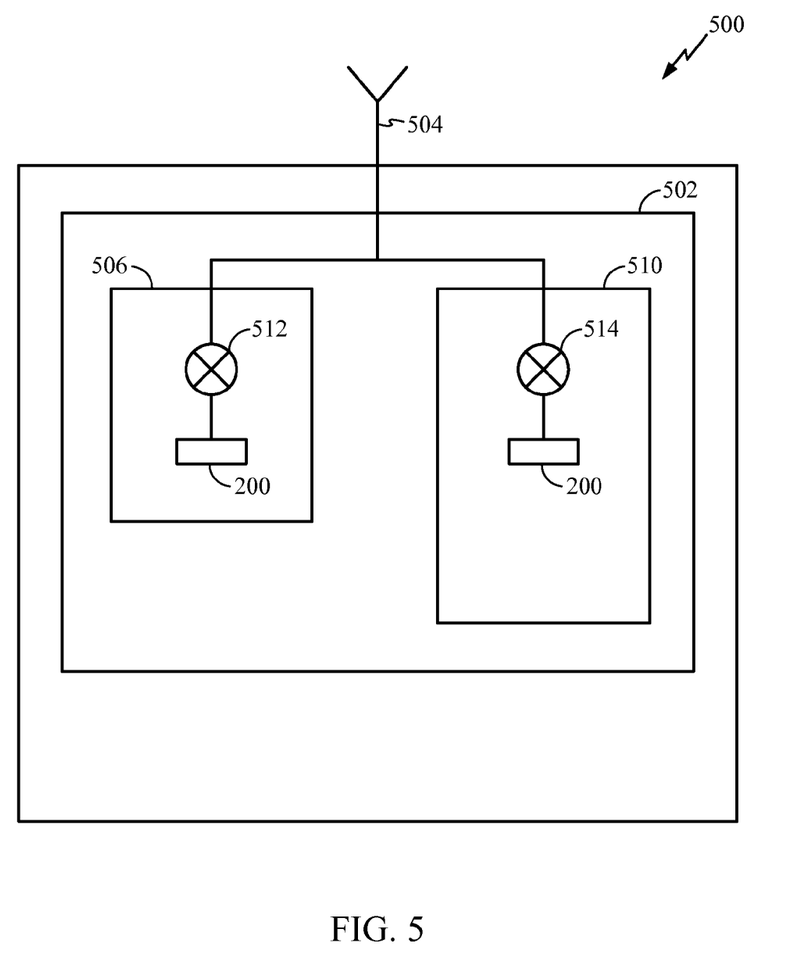
FIG. 5 is a functional block diagram of a radio system in which the charge pump of FIG. 2 may be used.

Referring now to FIG. 5, a radio system 500 is illustrated in which the charge pump 200 described herein may be used. The radio system 500 may be a mobile cellular telephone for example. The charge pump 200 may be used as a subcircuit in a phase locked loop to generate a clock signal or to provide a frequency synthesizer to provide various carrier frequency signals which may be used with one or more mixers to up-convert or down-convert RF signals in radio frequency circuits.

The radio system 500 includes a radio frequency RF circuit 502 coupled to an antenna 504. The RF circuit 502 may include one or both of an RF transmitter 506 and an RF receiver 510 coupled to the antenna 504. One or more charge pumps 200 may be used in the RF transmitter 506 and/or the RF receiver 510. A charge pump 200 may be coupled to a mixer 512 in the RF transmitter 506. A charge pump 200 may be coupled to a mixer 514 in the RF receiver 510.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Instead, the embodiments of the invention should be construed according to the claims that follow below.

What is claimed is:

1. A circuit comprising:
   a voltage controlled oscillator to generate an output clock signal of variable frequency in response to a direct current control voltage;
   a frequency divider coupled to the voltage controlled oscillator, the frequency divider configured to divide down a frequency of the output clock signal to generate a frequency divided output signal;
   a phase frequency detector coupled to the frequency divider and configured to compare a phase and frequency of a reference clock signal with a phase and frequency of the frequency divided output signal to generate frequency control signals; and
   a charge pump configured to generate an output control voltage based on the frequency control signals, the charge pump having a first auxiliary switching transistor and a second auxiliary switching transistor that are coupled in series between a first intermediate node of a plurality of series coupled transistors and a second intermediate node of the plurality of series coupled transistors, the first auxiliary switching transistor and the second auxiliary switching transistor to switch on to provide an equalization path between the first intermediate node and the second intermediate node to reduce noise in the output of the charge pump, wherein the charge pump further includes:
   a biased transistor having a terminal coupled to the first intermediate nodes;
   a gate terminal coupled to an output of an operational amplifier;
   a first main switching transistor having a first terminal coupled to a positive power supply and a second terminal coupled to the first intermediate node;
   a second main switching transistor coupled to ground; and
   a second biased transistor coupled between a charge pump output terminal of the charge pump and the second main switching transistor, wherein a second terminal of the biased transistor is coupled to the charge pump output terminal of the charge pump, and wherein the first main switching transistor and the second main switching transistor are configured to charge the charge pump output terminal of the charge pump.

2. The circuit of claim 1, further comprising a low pass filter coupled between the charge pump and the voltage controlled oscillator, the low pass filter configured to substantially filter out undesired alternating current components in the output control voltage to generate the direct current control voltage.

3. The circuit of claim 1, wherein the circuit is a frequency synthesizer of a radio system.

4. The circuit of claim 1, wherein a non-inverting input of the operational amplifier is coupled to the second terminal of the biased transistor.

5. The circuit of claim 4, wherein the charge pump includes a resistor coupled in series with a capacitor, wherein the capacitor is coupled to the output of the operational amplifier, and wherein the resistor is coupled to an inverting input of the operational amplifier.

6. The circuit of claim 4, wherein the charge pump includes a second plurality of series coupled transistors comprising:
   a first transistor, wherein a first terminal of the first transistor is coupled to a power supply;
   a second transistor, wherein a first terminal of the second transistor is coupled to a second terminal of the first transistor and wherein a gate terminal of the second transistor is coupled to the output of the operational amplifier;
   a third transistor, wherein a first terminal of the third transistor is coupled to a second terminal of the second transistor; and
   a fourth transistor, wherein a first terminal of the fourth transistor is coupled to a second terminal of the third transistor and wherein the second terminal of the fourth transistor is coupled to the ground.

7. The circuit of claim 6, wherein the first terminal of the third transistor is further coupled to an inverting input of the operational amplifier.

8. The circuit of claim 6, wherein a gate terminal of the third transistor is coupled to a gate terminal of the second biased transistor.

9. The circuit of claim 1, wherein the first auxiliary switching transistor and the second auxiliary switching transistor are turned on concurrently.

10. The circuit of claim 1, wherein the first intermediate node is selectively discharged to the second intermediate node through the first auxiliary switching transistor and the second auxiliary switching transistor.

11. An apparatus comprising:
   means for generating an output clock signal based on a direct current control voltage;
   means for dividing down a frequency of the output clock signal to generate a frequency divided output signal;

means for detecting a phase and frequency by comparing a phase and frequency of a reference clock signal with a phase and frequency of the frequency divided output signal to generate frequency control signals; and means for generating an output control voltage based on the frequency control signals, the means for generating the output control voltage comprising a first auxiliary switching transistor and a second auxiliary switching transistor that are coupled in series between a first intermediate node of a plurality of series coupled transistors and a second intermediate node of the plurality of series coupled transistors, the first auxiliary switching transistor and the second auxiliary switching transistor configured to switch on to provide an equalization path between the first intermediate node and the second intermediate node, wherein the means for generating the output control voltage further includes:

a biased transistor having a terminal coupled to the first intermediate nodes;

a gate terminal coupled to an output of an operational amplifier;

a first main switching transistor having a first terminal coupled to a positive power supply and a second terminal coupled to the first intermediate node;

a second main switching transistor coupled to ground; and a second biased transistor coupled between an output terminal of the means for generating the output control voltage and the second main switching transistor, wherein a second terminal of the biased transistor is coupled to the output terminal of the means for generating the output control voltage, and wherein the first main switching transistor and the second main switching transistor are configured to charge the output terminal of the means for generating the output control voltage.

12. The apparatus of claim 11, further comprising means for filtering out undesired components of the output control voltage to generate the direct current control voltage.

13. The apparatus of claim 11, wherein a non-inverting input of the operational amplifier is coupled to the second terminal of the biased transistor.

14. The apparatus of claim 13, wherein the means for generating the output control voltage further includes a resistor coupled in series with a capacitor, wherein the capacitor is coupled to the output of the operational amplifier, and wherein the resistor is coupled to an inverting input of the operational amplifier.

15. The apparatus of claim 14, wherein the means for generating the output control voltage further includes a second plurality of series coupled transistors comprising:

a first transistor, wherein a first terminal of the first transistor is coupled to a power supply;

a second transistor, wherein a first terminal of the second transistor is coupled to a second terminal of the first transistor and wherein a gate terminal of the second transistor is coupled to the output of the operational amplifier;

a third transistor, wherein a first terminal of the third transistor is coupled to a second terminal of the second transistor; and a fourth transistor, wherein a first terminal of the fourth transistor is coupled to a second terminal of the third transistor and wherein the second terminal of the fourth transistor is coupled to the ground.

16. The apparatus of claim 15, wherein the first terminal of the third transistor is further coupled to the inverting input of the operational amplifier.

17. The apparatus of claim 15, wherein a gate terminal of the third transistor is coupled to a gate terminal of the second biased transistor.

18. A method comprising:

generating an output clock signal based on a direct current control voltage;

dividing down a frequency of the output clock signal to generate a frequency divided output signal;

detecting a phase and frequency of the frequency divided output signal by comparing a phase and frequency of a reference clock signal with the phase and frequency of the frequency divided output signal to generate frequency control signals; and generating, by a charge pump, an output control voltage based on the frequency control signals, the charge pump comprising a first auxiliary switching transistor and a second auxiliary switching transistor that are coupled in series between a first intermediate node of a plurality of series coupled transistors and a second intermediate node of the plurality of series coupled transistors, the first auxiliary switching transistor and the second auxiliary switching transistor configured to switch on to provide an equalization path between the first intermediate node and the second intermediate node, wherein the charge pump further includes:

a biased transistor having a terminal coupled to the first intermediate nodes;

a gate terminal coupled to an output of an operational amplifier;

a first main switching transistor having a first terminal coupled to a positive power supply and a second terminal coupled to the first intermediate node;

a second main switching transistor coupled to ground; and a second biased transistor coupled between a charge pump output terminal of the charge pump and the second main switching transistor, wherein a second terminal of the biased transistor is coupled to the charge pump output.

19. The method of claim 18, further comprising filtering out undesired components of the output control voltage to generate the direct current control voltage.

* * * * *